(12) United States Patent
Dally et al.

(10) Patent No.: US 8,604,855 B2
(45) Date of Patent: Dec. 10, 2013

(54) DUAL-TRIGGER LOW-ENERGY FLIP-FLOP CIRCUIT

(71) Applicant: NVIDIA Corporation, Santa Clara, CA (US)

(72) Inventors: William J. Dally, Los Altos Hills, CA (US); Jonah M. Alben, San Jose, CA (US); John W. Poulton, Chapel Hill, NC (US); Ge Yang, Dublin, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 13/921,138

(22) Filed: Jun. 18, 2013

(65) Prior Publication Data

US 2013/0278315 A1 Oct. 24, 2013

Related U.S. Application Data

(62) Division of application No. 13/033,426, filed on Feb. 23, 2011, now Pat. No. 8,487,681.

(51) Int. Cl.
*H03K 3/356* (2006.01)

(52) U.S. Cl.
USPC ........... 327/218; 327/208; 327/210; 327/211; 327/212; 326/95; 326/98

(58) Field of Classification Search
USPC ......... 327/199–203, 208–214, 218, 219, 223, 327/225; 326/93–98
See application file for complete search history.

(56) References Cited

U.S. PATENT DOCUMENTS

| | | | | |
|---|---|---|---|---|
| 7,872,514 | B2 * | 1/2011 | Chee | 327/218 |
| 8,373,483 | B2 * | 2/2013 | Dally | 327/202 |
| 8,487,681 | B2 * | 7/2013 | Dally et al. | 327/218 |

OTHER PUBLICATIONS

Notice of Preliminary Rejection from Korean Patent Application No. 10-2013-0059518, dated Jul. 31, 2013.
Notice of Allowance from Korean Patent Application No. 10-2012-0018367, dated Jul. 31, 2013.

* cited by examiner

*Primary Examiner* — Patrick O'Neill
(74) *Attorney, Agent, or Firm* — Zilka-Kotab, PC

(57) ABSTRACT

One embodiment of the present invention sets forth a technique for technique for capturing and storing a level of an input signal using a dual-trigger low-energy flip-flop circuit that is fully-static and insensitive to fabrication process variations. The dual-trigger low-energy flip-flop circuit presents only three transistor gate loads to the clock signal and none of the internal nodes toggle when the input signal remains constant. One of the clock signals may be a low-frequency "keeper clock" that toggles less frequently than the other two clock signal that is input to two transistor gates. The output signal Q is set or reset at the rising clock edge using separate trigger sub-circuits. Either the set or reset may be armed while the clock signal is low, and the set or reset is triggered at the rising edge of the clock.

20 Claims, 7 Drawing Sheets

… … …

DUAL-TRIGGER LOW-ENERGY FLIP-FLOP CIRCUIT

CROSS-REFERENCE TO RELATED APPLICATIONS

This application is a divisional of U.S. application Ser. No. 13/033,426, filed Feb. 23, 2011, which is incorporated herein by reference in its entirety.

BACKGROUND OF THE INVENTION

1. Field of the Invention

The present invention generally relates to digital flip-flop circuits and more specifically to a dual-trigger low-energy flip-flop circuit that is fully-static and insensitive to fabrication process variations.

2. Description of the Related Art

Power dissipation is a significant problem in conventional integrated circuits. A large fraction of the power dissipated in conventional digital integrated circuits is consumed in the clock network. The amount of energy that is consumed by flip-flops due to data transitions is small because the activity factor, the fraction of time the data input of the flip-flop toggles, is quite low, typically about 5-10%. In contrast, the clock input load and clock energy is an increasingly important metric to consider when determining the energy that is consumed by the latches and flip-flops in a conventional integrated circuit. Reducing the clock-switched capacitance by a given amount produces 10× the power savings compared with reducing the data-switched capacitance by the same amount.

FIG. 1 illustrates a conventional flip-flop circuit 100. The flip-flop circuit 100 includes 26 transistors, including the inverters used to generate clkN and clkP. Each of the clock signals, clkP has a load of four transistor devices and clkN ha a load of six transistor devices. At each clock transition, 12 transistor gates (and corresponding wires) toggle, including the gates coupled to the clk signal.

FIG. 2 illustrates another conventional flip-flop circuit 200 that is sometimes referred to as the StrongARM flip-flop. Compared with the flip-flop circuit 100, the total clock load presented to Clk 220 of the flip-flop circuit 200 is only three transistor devices. The total number of transistors in the flip-flop circuit 200 is twenty, where each NAND gate includes four transistors. However, half of the internal nodes toggle each clock cycle. The internal nodes include the gates that are coupled to Clk 220 and the node 210. The node 210 is coupled to four transistor gates and three transistor sources or drains. The total number of internal nodes that toggle each clock cycle is seven gates and ten transistor sources or drains or the equivalent of approximately seventeen gate loads. Suppose input d is high and all of the internal nodes are initially high (Vdd or a Vt drop below Vdd). When the Clk 220 goes high both source and drain of input transistor 201 go low, both source and drain of the transistor 202 go low, the drain of transistor 203 goes low, both sides of bridging transistor 204 go low, both the source and drain of input transistor 205 go low, and the source of transistor 206 goes low.

Accordingly, what is needed in the art is a flip-flop circuit that reduces the energy consumed by reducing the number of internal nodes that toggle during a clock cycle. Additionally, the flip-flop circuit should function independent of fabrication process variations by not relying on sizing relationships between different transistors in the flip-flop circuit.

SUMMARY OF THE INVENTION

One embodiment of the present invention sets forth a technique for capturing and storing a level of an input signal using a dual-trigger, low-energy flip-flop circuit that is fully-static and insensitive to fabrication process variations. The dual-trigger, low-energy flip-flop circuit presents only three transistor gate loads to the clock signal and none of the internal nodes toggle when the input signal remains constant. One of the clock signals may be a low-frequency "keeper clock" that toggles less frequently than the other two clock signal that is input to two transistor gates.

Various embodiments of the invention comprise a dual-trigger low-energy flip-flop circuit including a trigger sub-circuit and a latch sub-circuit. The trigger sub-circuit includes a first clock-activated transistor and is configured to arm either a first trigger signal or a second trigger signal when an input signal to the dual-trigger low-energy flip-flop circuit is at a different level than a level of an output signal generated by the dual-trigger low-energy flip-flop circuit. The latch sub-circuit includes a second clock-activated transistor and is configured to change the level of the output signal when either the first trigger or the second trigger is armed and a clock signal transitions from a first level to a second level and maintain the level of the output signal when neither the first trigger or the second trigger is armed.

One advantage of the disclosed dual-trigger low-energy flip-flop circuit is that the transistor device load on the clock signal is reduced to only three transistor gates. Therefore, the clock energy is reduced significantly compared with flip-flop circuits having greater loads on the clock signal. Additionally, the internal nodes are driven high or low during stable states of the circuit to produce a fully static design that does not rely on sizing relationships between the different transistors, such as transistors configured as sense amplifiers. Therefore, the dual-trigger low-energy flip-flop circuit operation is robust, even when the characteristics of the transistors vary due to the fabrication process. The required input signal hold time is also quite short, only a single gate delay following the rising clock edge.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1:
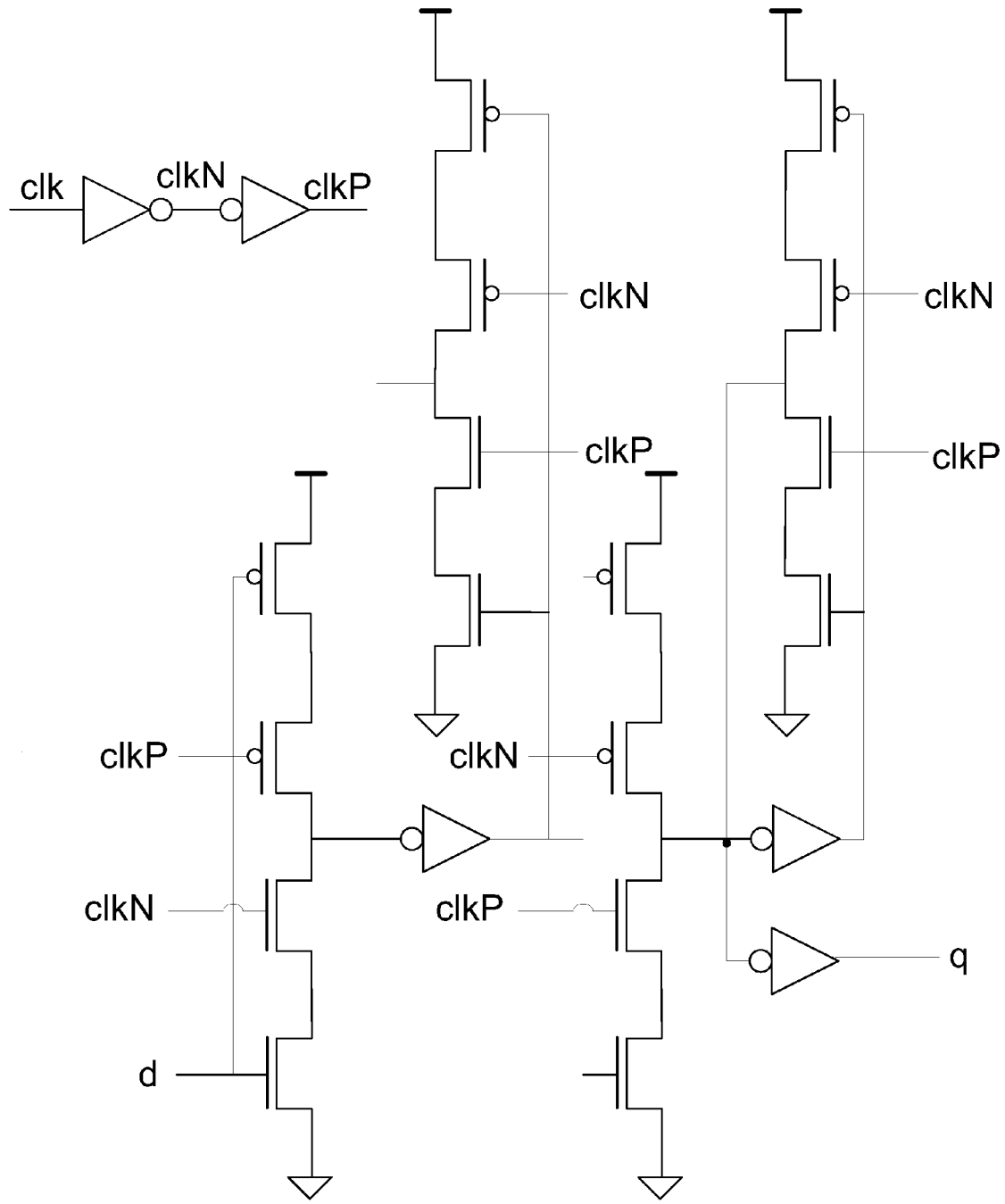
FIG. 1 illustrates a conventional flip-flop circuit, according to the prior art.
Figure 2:
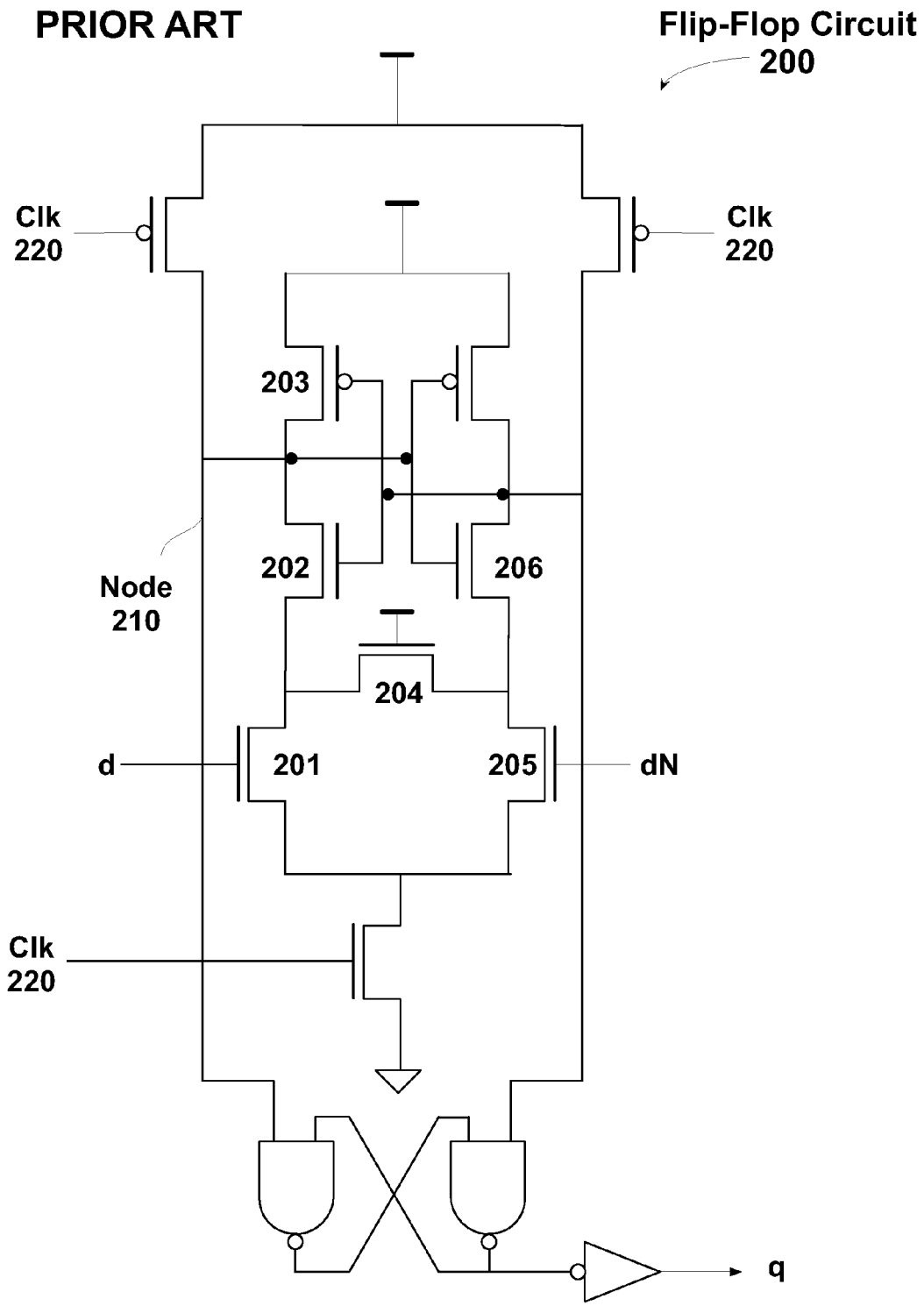
FIG. 2 illustrates another conventional flip-flop circuit, according to the prior art.
Figure 3A:
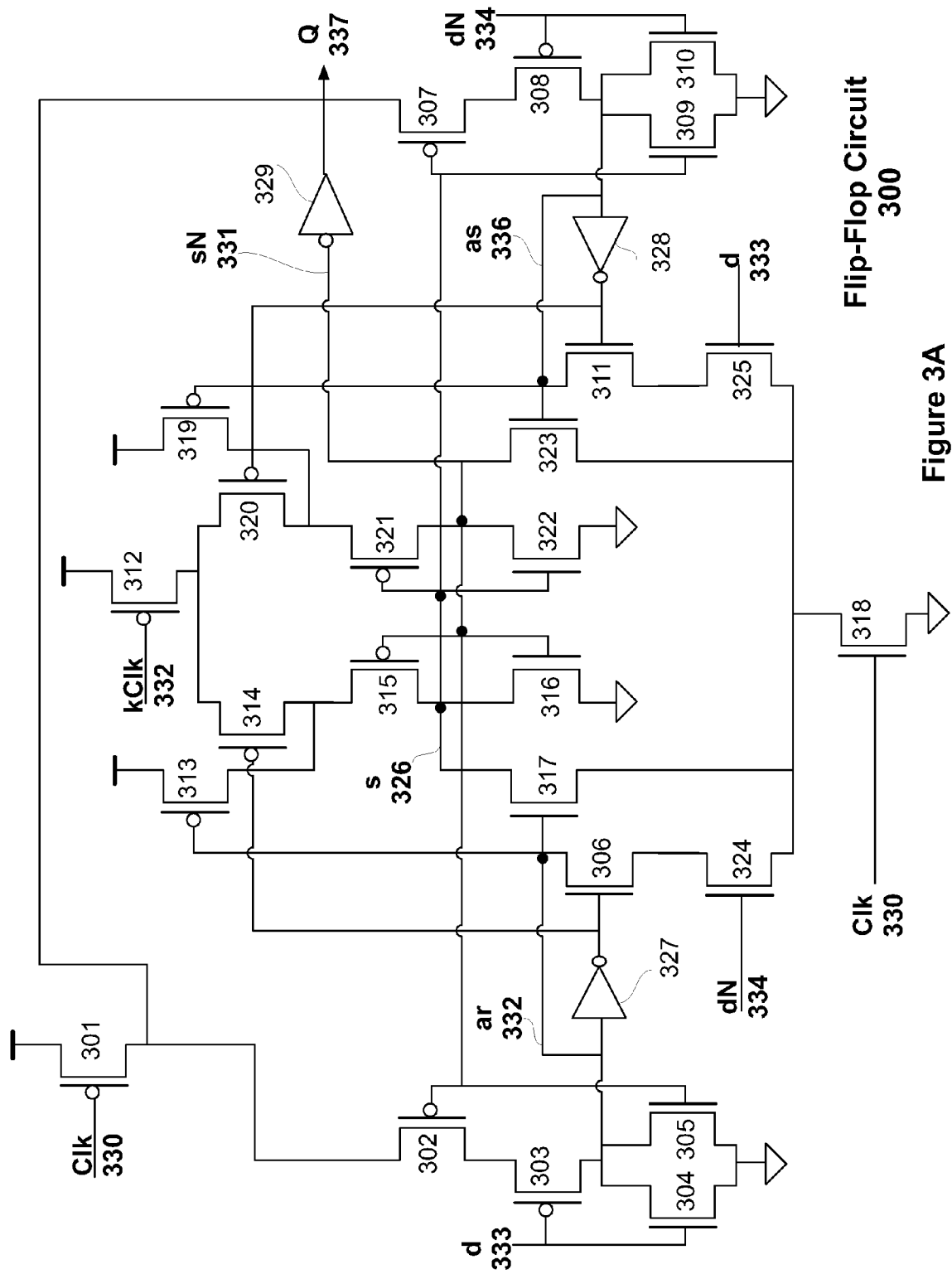
FIG. 3A illustrates a dual-trigger low-energy flip-flop circuit, according to one embodiment of the invention.

FIG. 3A illustrates a dual-trigger low-energy flip-flop circuit 300, according to one embodiment of the invention. The flip-flop circuit 300 is a fully-static, clock-energy efficient flip-flop that presents only three loads to the clock and does not depend on transistor device size relationships. As shown in FIG. 3A transistors 304, 305, 306, 324, 317, 316, 322, 323, 311, 325, 309, and 310 are NMOS devices and transistors 303, 302, 301, 312, 313, 314, 315, 319, 320, 321, 307, and 308 are PMOS devices. The flip-flop circuit 300 includes four main sub-circuits, a reset trigger sub-circuit, a set trigger sub-circuit, an output buffer, and an AND-OR-INVERT (AOI) RS (reset-set) latch. Transistors 301, 302, 303, 304, 305, 306, 324, and inverter 327 are configured to form the reset trigger sub-circuit. Transistors 301, 307, 308, 309, 310, 311, 325, and inverter 328 are configured to form the set trigger sub-circuit. Note that transistor 301 is shared between the reset trigger sub-circuit and the set trigger sub-circuit.

When the input signal d 333 changes to a level that is different than the level of the output Q 337 when the Clk 330 is low, one of the two trigger circuits is "armed," i.e., configured to set or reset the output Q 337 at the next rising edge of the Clk 330. If d 333 changes value again, so that d 333 is the same level as Q 337 while the clk 330 is still low, the armed trigger circuit is unarmed.

The reset trigger sub-circuit asserts the arm reset signal, ar 332, pulling ar 332 to a high level, when the input signal d 333 is low and Q 337 is high and the clk 330 is low. The reset is triggered to force the output signal Q 337 to a low level when the Clk 330 transitions from low to high. The set trigger sub-circuit asserts the arm set signal, as 336, pulling as 336 up to a high level, when the input signal dN 334 (complement of d 333) is low Q and Q 337 is high and the clock is low. The set is triggered to force the output signal Q 337 to a high level when the clock 330 transitions from low to high. Note that the ar 332 and as 336 signals are never asserted simultaneously. When the input signal d 333 and the output signal Q 337 are at the same level both ar 332 and as 336 are low.

Transistors 312, 313, 314, 315, 316, 317, 318, 319, 320, 321, 322, and 323 are configured to form the AOI RS latch circuit. Inverter 329 is configured to buffer the output of the AOI RS latch and generate the flip-flop output Q 337. In contrast with the trigger sub circuits that are enabled when the clk 330 is low, the AOI RS latch circuit is enabled when the clk 330 is high. Transistors 314 and 320 are isolation transistors that are configured as pull-up devices and transistors 324 and 325 are isolation transistors that are configured as pull-down devices.

If either the reset trigger sub-circuit or the set trigger sub-circuit is armed when the clk 330 rises, a state transition is triggered. In particular, if as 336 is asserted when clk 330 rises, the latch sub-circuit is set by pulling node sN 331 low via clock-enabled pull-down transistor 318 and transistor 323. When as 336 rises, transistor 319 is turned off to disable the flow of current through transistor 319 and 321 and remove power from node sN 331. As soon as the node sN 331 is pulled down, the data input dN 334 can safely change. Thus, the hold time requirement for input dN 334 is the delay for pulling the node sN 331 down through transistor 323 and clock-enabled transistor 318 following the rising edge of the clock 330. When the node sN 331 goes low, node s 326 is pulled up by transistors 315 and 313. Since the state transition was triggered by as 336, the signal ar 332 is guaranteed to be low. Once s 326 goes high, as 336 is pulled low. However, as 336 may already have transitioned low due to a change in dN 334.

The triggering of a reset proceeds in a similar manner. If ar 332 is high when clk 330 rises, node s 326 is pulled down, which in turn pulls up node sN 331, which in turn pulls down ar 332. In particular, if ar 332 is asserted when clk 330 rises, the latch sub-circuit is reset by pulling node s 326 low via clock-enabled pull-down transistor 318 and transistor 317. When ar 332 rises, transistor 313 is turned off to disable the flow of current through transistor 313 and 315 and remove power from node s 326. As soon as the node s 326 is pulled down, the data input d 333 can safely change. Thus, the hold time requirement for input d 333 is the delay for pulling the node s 326 down through transistor 317 and clock-enabled transistor 318 following the rising edge of the clock 330. When the node s 326 goes low, sN 331 is pulled up by transistors 321 and 320. Since the state transition was triggered by ar 332, the signal as 336 is guaranteed to be low. Once sN 331 goes high, ar 332 is pulled low. However, ar 332 may already have transitioned low due to a change in d 333.

The transistor 312 receives a keeper clock signal, kClk 332. Transistor 312 is configured as a keeper transistor that operates to restore a small amount of charge that leaks off of the common node of transistors 313 and 314 and the common node of transistors 319 and 320. Therefore, it is not necessary to activate kclk 332 every clock cycle. It is sufficient for the keeper clock signal kclk to go low once every N cycles, where N is small enough so that charge is restored to the common nodes. A value, N of 100, would suffice for most conditions and would result in the keeper clock load consuming only 1% of the energy of a clock load that toggled every cycle. The keeper clock signal kclk 312 should be gated high enough in the clock tree so that the clock load of an OR gate used to generate the keeper clock signal kclk 312 can be amortized over many flip-flop circuits 300. The keeper clock signal kClk 332 may be generated using a clock gating circuit that is described in patent application Ser. No. 13/008,894 filed Jan. 18, 2011, and titled "Low Energy Flip-Flops."

Transistors 314 and 320 are isolation transistors that are added to the s 326 and sN 331 AOI gates, respectively, to allow the clock-enabled pull-up transistor 312 to be shared by the cross-coupled inverters formed by transistors 315, 316, 321, and 322. When as 336 is low, the transistor 319 pulls up sN 331. When as 336 is high and the clk 330 is low, sN 331 is pulled up by the isolation transistor 320 and the clock-enabled pull-up transistor 312. In the remaining state, when as 336 is high and the clk 330 is high, node sN 331 is pulled down. Similarly, when ar 332 is low, the transistor 313 pulls up s 326. When ar 332 is high and the clk 330 is low, s 326 is pulled up by the isolation transistor 314 and the clock-enabled pull-up transistor 312. In the remaining state, when ar 332 is high and the clk 330 is high, node s 326 is pulled down.

Transistors 324 and 325 are isolation transistors that isolate ar 332 and as 326 when the clock 330 is low. Either d 333 or dN 334 is asserted to enable isolation transistor 325 or 324, respectively. When dN 334 is high and ar 332 is low, ar 332 is maintained at the low level by being pulled down through transistors 306, 324, and 318 as long as clk 330 remains high. Similarly, when d 333 is high and as 336 is low, as 336 is maintained at the low level by being pulled down through transistors 311, 325, and 318 as long as clk 330 is high. If the isolation transistors 324 and 325 were removed, current could pass between ar 332 and as 336 when the clock-enabled transistor 318 is disabled (clock 330 is low), interfering with proper operation of the latch sub-circuit.

Figure 3B:
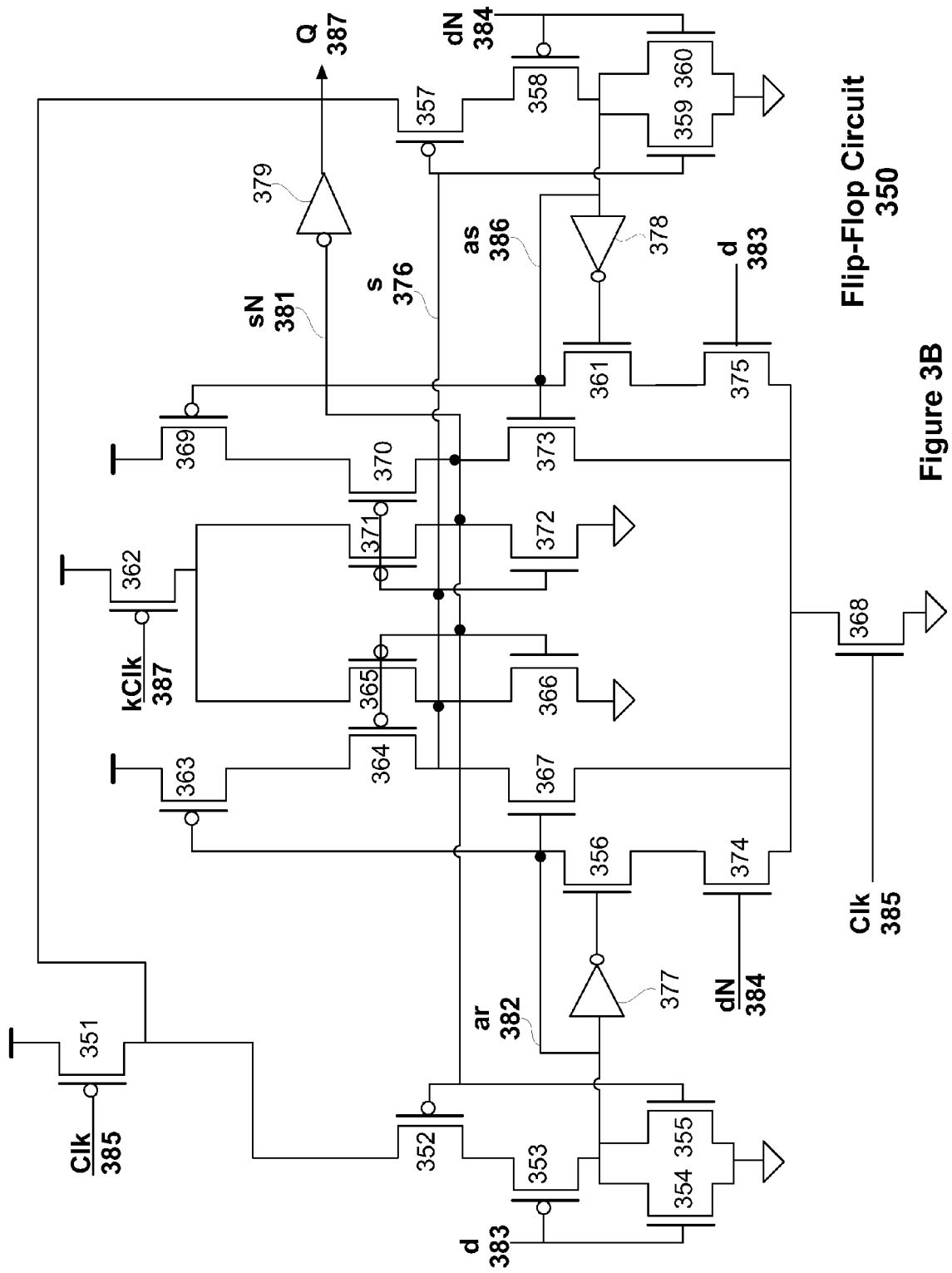
FIG. 3B illustrates another dual-trigger low-energy flip-flop circuit, in accordance with one or more aspects of the present invention.

FIG. 3B illustrates another dual-trigger low-energy flip-flop circuit 350, in accordance with one or more aspects of the present invention. As shown in FIG. 3B transistors 354, 355, 356, 374, 367, 366, 372, 373, 361, 375, 359, and 360 are NMOS devices and transistors 353, 352, 351, 362, 363, 364, 365, 369, 370, 371, 357, and 358 are PMOS devices. Like the flip-flop circuit 300, the flip-flop circuit 350 includes four main sub-circuits, a reset trigger sub-circuit, a set trigger sub-circuit, an output buffer, and an AND-OR-INVERT (AOI) RS (reset-set) latch. Transistors 351, 352, 353, 354, 355, 356, 374, and inverter 377 are configured to form the reset trigger sub-circuit that performs the same function as the reset trigger sub-circuit of the flip-flop circuit 300. Transistors 351, 357, 358, 359, 360, 361, 375, and inverter 378 are configured to form the set trigger sub-circuit that performs the same function as the set trigger sub-circuit of the flip-flop circuit 300. Note that the clock-enabled pull-up transistor 351 is shared between the reset trigger sub-circuit and the set trigger sub-circuit. The input signals d 383 and dN 384, clk 385, and kClk 387 perform similar functions to previously described input signals d 333, dN 334, clk 330, and kClk 332, respectively. Similarly, the signals ar 382 and as 386 and nodes s 376 and sN 381 operate in a similar manner to signals ar 332 and as 336 and nodes s 326 and sN 331, respectively, of the flip-flop circuit 300. Transistors 374 and 375 are isolation transistors that perform the same functions as previously described transistors 324 and 325.

The primary difference between the flip-flop circuit 350 and flip-flop circuit 300 is that the isolation transistors 314 and 320 are omitted from the flip-flop circuit 350 and isolation transistors 365 and 371 are added to the flip-flop circuit 350. The gate and drain of transistor 371 are tied in parallel with the gate and drain of transistor 370. This duplication provides two source terminals, one on transistor 371 and one on transistor 370 that pull up sN 381 when s 376 is low. Splitting these source terminals isolates the drain of transistor 369 from the drain of the clock-enabled pull-up transistor 362. Similarly, the gate and drain of transistor 364 are tied in parallel with the gate and drain of transistor 365 and transistor 365 is configured to isolate the drain of transistor 363 from the shared clock-enabled pull-up transistor 362. Including transistors 364 and 370 enables the isolation transistors 365 and 371 to share the clock-enabled pull-up transistor 362. Without the isolation transistors 365 and 371, an additional clock-enabled pull-up transistor would be required, increasing the clock load of the latch circuit 350.

Figure 4:
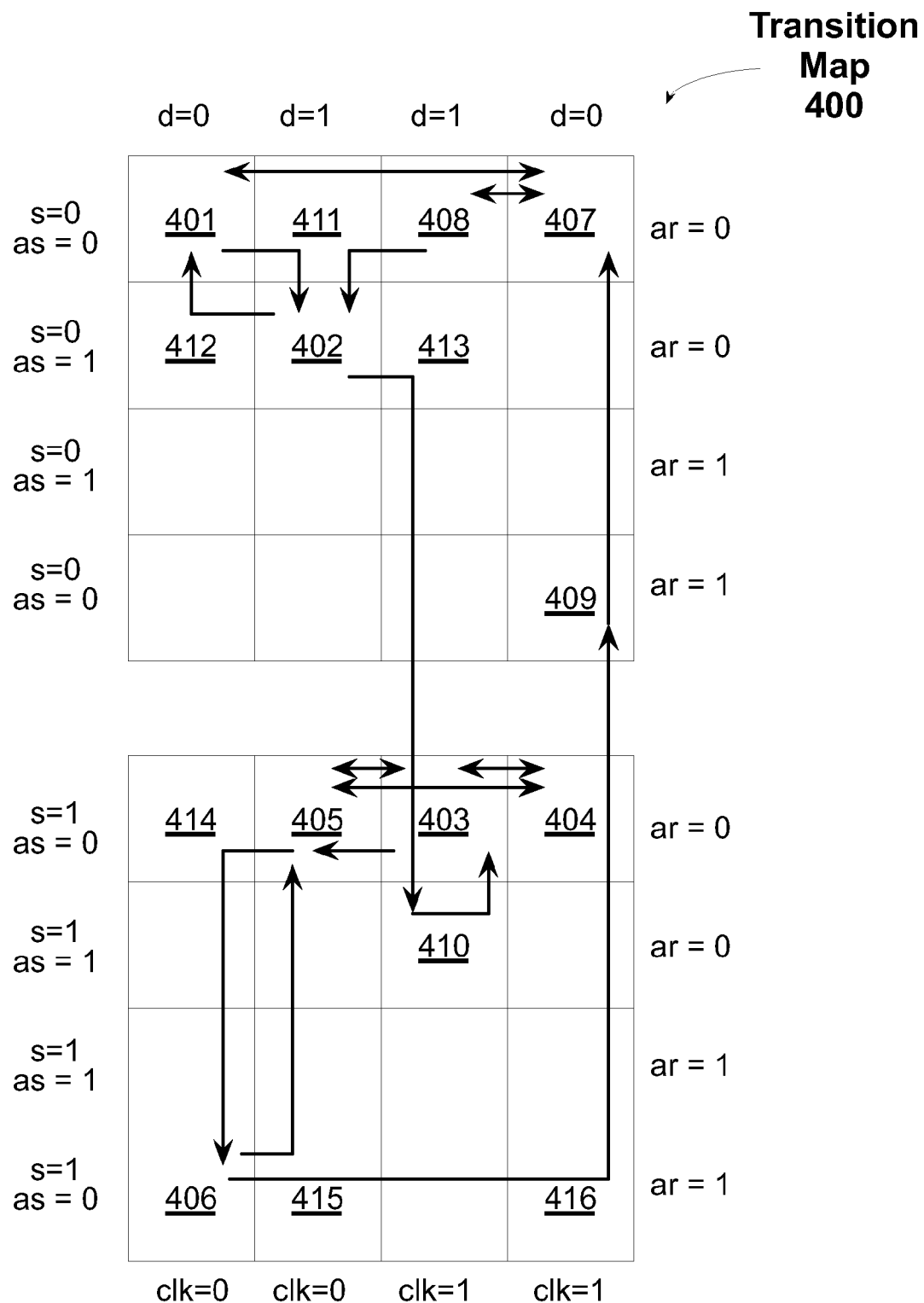
FIG. 4 is a transition map diagram showing legal transitions for the dual-trigger low-energy flip-flop circuit for each combination of input signals, in accordance with one or more aspects of the present invention.

FIG. 4 is a transition map diagram 400 showing legal transitions for the dual-trigger low-energy flip-flop circuit 300 or 350 for each combination of input signals, in accordance with one or more aspects of the present invention. The behavior of the dual-trigger flip-flop circuits 300 and 350 may be understood by considering each of the flip-flop circuits to be an asynchronous finite state machine and following the state transitions on the transition map 400. The transition map 400 plots the states of the input variables (d and clk) on the horizontal axis and the state variables (as, ar, and s) on the vertical axis. All horizontal transitions are input stimulus. All vertical transitions are the response of the flip-flop circuit 300 or 350 to the input stimulus.

The flip-flop circuit 300 or 350 has eight stable states labeled 401, 402, 403, 404, 405, 406, 407, and 408. There are six transient states labeled 411, 412, 413, 414, 415, and 416 that reflect the state of the circuit after an input change but before the circuit's response to that change. There are two transient states labeled 409 and 410 that reflect a state transition without an input stimulus.

Consider starting in state 401 with clk=d=q=0. As with all stable states, there are two possibilities, clk can change, or d can change. (As with all flip-flops, the setup and hold time constraints guarantee the fundamental mode assumption for the flip-flop circuit 300 and 350.) If clk rises in state 401, the flip-flop circuit 300 or 350 transitions to state 407 with no response from the flip-flop circuit 300 or 350. If d rises in state 401 we go to state 402 and the flip-flop circuit 300 or 350 asserts as, arming the set trigger. In state 402, the data transitioning back to 0 will return the flip-flop circuit 300 or 350 state 401, unarming the set trigger. If data toggles while the clock is low, the flip-flop circuit 300 or 350 can cycle around the loop between states 401 and 402.

If the clk rises while the flip-flop circuit 300 or 350 is in state 402, the flip-flop circuit 300 or 350 responds by asserting s, thereby triggering the set. The flip-flop circuit 300 or 350 transitions from state 402 to the transient state 410 and immediately transitions to state 403 as s rising causes as to fall. When the flip-flop circuit 300 or 350 is in state 403 and the clock falls, the flip-flop circuit 300 or 350 transitions to state 405. State 405 is analogous to state 401, but with d=s=1.

The reset sequence occurs when the flip-flop circuit 300 or 350 transitions from state 405 when d=1 and q=1 to state 406 when d falls, arming the reset trigger. In state 406, the data transitioning back to 1 will return the flip-flop circuit 300 or 350 to state 405, unarming the reset trigger. If data toggles while the clock is low, the flip-flop circuit 300 or 350 can cycle around the loop between states 405 and 406. If the clk rises while the flip-flop circuit 300 or 350 is in state 406, the flip-flop circuit 300 or 350 responds by negating s, thereby triggering the reset. The flip-flop circuit 300 or 350 transitions from state 406 to the transient state 409 and immediately transitions to state 407 as s falling causes ar to fall. When the flip-flop circuit 300 or 350 is in state 407 and the clock falls, the flip-flop circuit 300 or 350 transitions to state 401.

When s=d=0, input changes cause transitions between states 401, 407, and 408 occur with no response in the flip-flop circuit 300 or 350. Similarly, when s=d=1, input changes cause transitions between states 403, 404, and 405 occur with no response in the flip-flop circuit 300 or 350. Only when clk is low and d≠s does the flip-flop circuit 300 or 350 transition to the armed state 402 or 406. If the flip-flop circuit 300 or 350 is in an armed state when clk rises, the appropriate trigger takes place—setting or resetting the flip-flop circuit 300 or 350 by transitioning to state 403 via transient state 410 or state 407 via transient state 409, respectively.

An analysis of the flip-flop circuit 300 or 350 shows that all major nodes (as, ar, s, and sN) are driven either high or low in each of the eight stable states 401, 402, 403, 404, 405, 406, 407, and 408. Thus the flip-flop circuit 300 or 350 is fully static. Node as is undriven briefly during the transient state 413 (on the way to transient state 410). Similarly node ar is undriven briefly during the transient state 416 (on the way to transient state 409). However, since these transient states 413 and 416 persist for only one or two gate delays, floating nodes in these states are not a concern. All nodes are driven in the transient states 411, 412, 413, and 415.

Figure 5:
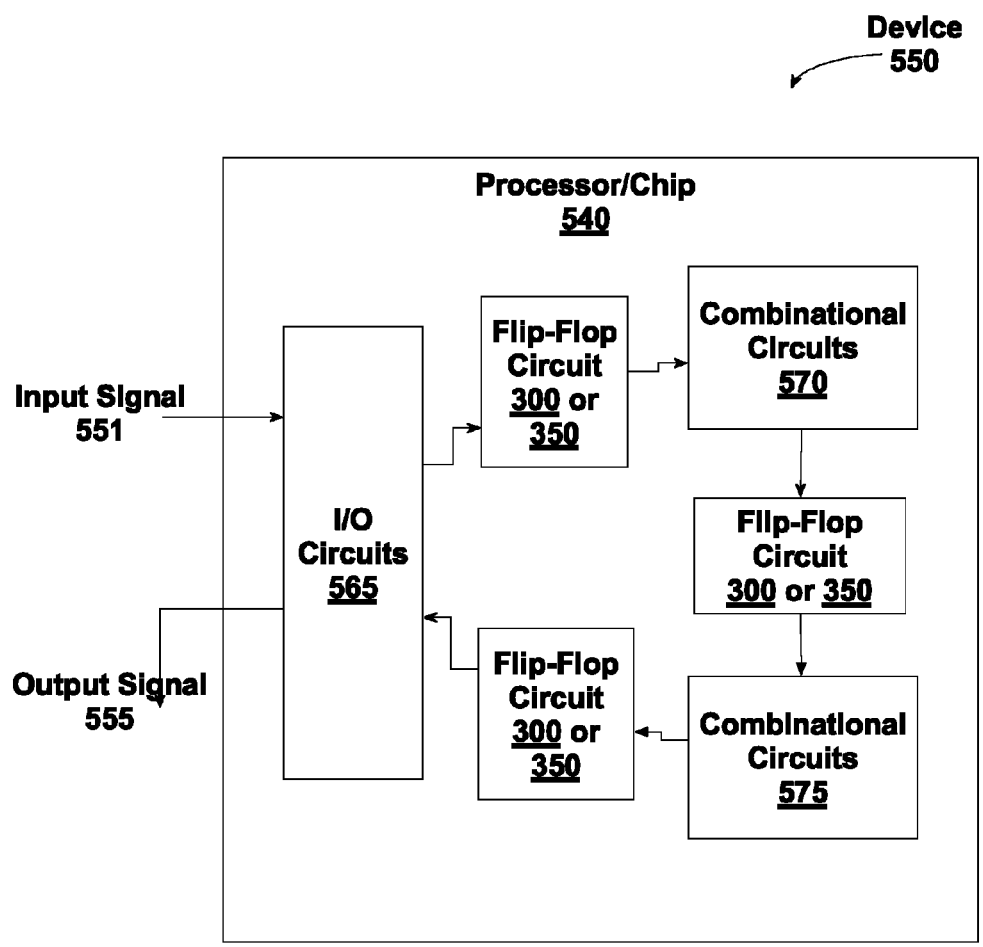
FIG. 5 is a block diagram illustrating a processor/chip including the dual-trigger low-energy flip-flop circuit shown in FIGS. 3A and 3B, in accordance with one or more aspects of the present invention.

FIG. 5 is a block diagram illustrating a processor/chip 540 including the flip-flop circuit 300 from FIG. 3A or the flip-flop circuit 350 from FIG. 3B, in accordance with one or more aspects of the present invention. I/O circuits 565 may include pads and other I/O specific circuits to send and receive signals from other devices in a system. Output signal 555 is produced by I/O circuits 565 based on signals received by the I/O circuits 565. The input signal 551 is received by the I/O circuits 565 and is input to the first flip-flop circuit 300 or 350 for storage. The I/O circuits 565 also provide clock signals to the flip-flop circuits 300 or 350. The combinational circuits 570 receive the output generated by the first flip flop circuit 300 or 350 and generate a combinational output that is received by the second flip-flop circuit 300 or 350. The second flip-flop circuit 300 or 350 stores the combinational output and generates an output that is input to the combinational circuits 572. The output of the combinational circuits 572 is received and stored by the third flip-flop circuit 300 or 350. The third flip-flop circuit 300 or 350 generates an output that is provided to the I/O circuits 565. The flip-flop circuits 300 or 350 may be used to store signals for multiple clock cycles or to pipeline signals that change as frequently as each clock cycle.

System Overview

Figure 6:
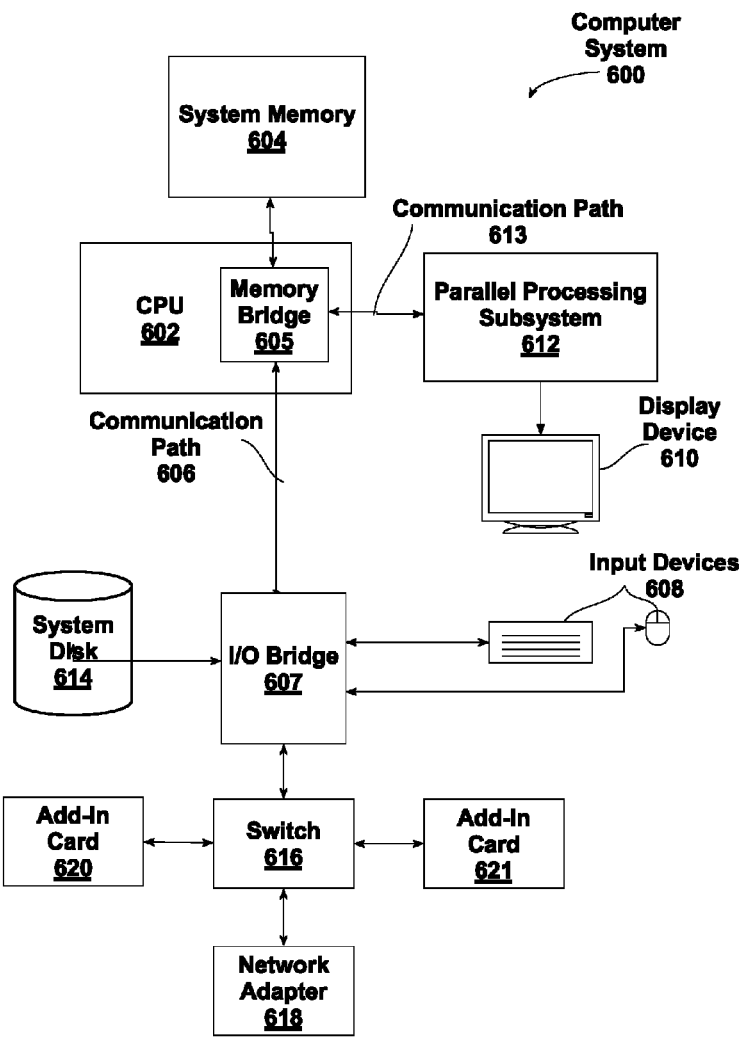
FIG. 6 is a block diagram illustrating a computer system configured to implement one or more aspects of the present invention.

FIG. 6 is a block diagram illustrating a computer system 100 configured to implement one or more aspects of the present invention. Computer system 600 includes a central processing unit (CPU) 602 and a system memory 604 communicating via a bus path through a memory bridge 605. Memory bridge 605 may be integrated into CPU 602 as shown in FIG. 6. Alternatively, memory bridge 605, may be a conventional device, e.g., a Northbridge chip, that is connected via a bus to CPU 602. Memory bridge 605 is connected via communication path 606 (e.g., a HyperTransport link) to an I/O (input/output) bridge 607. I/O bridge 607, which may be, e.g., a Southbridge chip, receives user input from one or more user input devices 608 (e.g., keyboard, mouse) and forwards the input to CPU 602 via path 606 and memory bridge 605. A parallel processing subsystem 612 is coupled to memory bridge 605 via a bus or other communication path 613 (e.g., a PCI Express, Accelerated Graphics Port, or HyperTransport link); in one embodiment parallel processing subsystem 612 is a graphics subsystem that delivers pixels to a display device 610 (e.g., a conventional CRT or LCD based monitor). A system disk 614 is also connected to I/O bridge 607. A switch 616 provides connections between I/O bridge 607 and other components such as a network adapter 618 and various add-in cards 620 and 621. Other components (not explicitly shown), including USB or other port connections, CD drives, DVD drives, film recording devices, and the like, may also be connected to I/O bridge 607. Communication paths interconnecting the various components in FIG. 6 may be implemented using any suitable protocols, such as PCI (Peripheral Component Interconnect), PCI-Express (PCI-E), AGP (Accelerated Graphics Port), HyperTransport, or any other bus or point-to-point communication protocol(s), and connections between different devices may use different protocols as is known in the art.

In one embodiment, the parallel processing subsystem 612 incorporates circuitry optimized for graphics and video processing, including, for example, video output circuitry, and constitutes a graphics processing unit (GPU). In another embodiment, the parallel processing subsystem 612 incorporates circuitry optimized for general purpose processing, while preserving the underlying computational architecture, described in greater detail herein. In yet another embodiment, the parallel processing subsystem 612 may be integrated with one or more other system elements, such as the memory bridge 605, CPU 602, and I/O bridge 607 to from a system on chip (SoC). One or more of CPU 602, parallel processing sub-system 612, I/O bridge 607, and switch 616 may include a dual-trigger low-energy flip-flop circuit 300 or 350.

It will be appreciated that the system shown herein is illustrative and that variations and modifications are possible. The connection topology, including the number and arrangement of bridges, may be modified as desired. For instance, in some embodiments, system memory 604 is connected to CPU 602 directly rather than through a bridge, and other devices communicate with system memory 604 via memory bridge 605 and CPU 602. In other alternative topologies, parallel processing subsystem 612 is connected to I/O bridge 607 or directly to CPU 602, rather than to memory bridge 605. In still other embodiments, one or more of CPU 602, I/O bridge 607, parallel processing subsystem 612, and memory bridge 605 may be integrated into one or more chips. The particular components shown herein are optional; for instance, any number of add-in cards or peripheral devices might be supported. In some embodiments, switch 616 is eliminated, and network adapter 618 and add-in cards 620, 621 connect directly to I/O bridge 607.

In sum, the dual-trigger low-energy flip-flop circuit 300 or 350 is fully static since all nodes are driven high or low during all stable states of the circuits. The flip-flop circuit is low energy since the internal nodes toggle only when the data changes and the loading of the clock is only three transistor gates. The hold time is quite short since the data inputs d and dN may change one gate delay following the rising edge of the clock. Additionally, the dual-trigger low-energy flip-flop circuits 300 and 350 do not rely on sizing relationships between the different transistors to function properly. Therefore, the flip-flop circuit operation is robust, even when the characteristics of the transistors vary due to the fabrication process.

One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

The invention has been described above with reference to specific embodiments. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

The invention claimed is:

1. A dual-trigger low-energy flip-flop circuit, comprising:
a first isolation transistor having a source that is coupled to a clock-enabled pull-up transistor and having a gate that is coupled to a complement of a first trigger signal;
a second isolation transistor having a source that is coupled to the clock-enabled pull-up transistor and having a gate that is coupled to a complement of a second trigger signal, wherein only one of the second trigger signal and the first trigger signal is asserted at a time;
a third transistor having a drain that is coupled to a drain of the first isolation transistor and a gate that is coupled to the first trigger signal; and a fourth transistor having a drain that is coupled to a drain of the second isolation transistor and a gate that is coupled to the second trigger signal.

2. The dual-trigger low-energy flip-flop circuit of claim 1, wherein the first trigger signal is a reset trigger that resets an output signal of the dual-trigger low-energy flip-flop circuit.

3. The dual-trigger low-energy flip-flop circuit of claim 1, wherein the second trigger signal is a set trigger that sets an output signal of the dual-trigger low-energy flip-flop circuit.

4. The dual-trigger low-energy flip-flop circuit of claim 1, wherein the output signal is reset when a clock signal transitions from low to high.

5. The dual-trigger low-energy flip-flop circuit of claim 1, wherein the output signal is set when a clock signal transitions from low to high.

6. The dual-trigger low-energy flip-flop circuit of claim 1, wherein the third transistor is a pull-up transistor.

7. The dual-trigger low-energy flip-flop circuit of claim 1, wherein the fourth transistor is a pull-up transistor.

8. The dual-trigger low-energy flip-flop circuit of claim 1, further comprising:
   a clock-enabled pull-down transistor;
   a third isolation transistor that is coupled to the clock-enabled pull-down transistor and configured to pull down the first trigger signal when an input signal is at a low level and the clock-enabled pull-down transistor is enabled, and
   a fourth isolation transistor that is coupled to the clock-enabled pull-down transistor and configured to pull down the second trigger signal when the input signal is at a high level and the clock-enabled pull-down transistor is enabled.

9. The dual-trigger low-energy flip-flop circuit of claim 8, wherein
   either the third isolation transistor or the fourth isolation transistor is disabled to isolate the first trigger signal from the second trigger signal when the clock-enabled pull-down transistor is disabled.

10. The dual-trigger low-energy flip-flop circuit of claim 8, wherein the clock-enabled pull-up transistor is enabled when the clock signal is at a first level and the clock-enabled pull-down transistor is enabled when the clock signal is at a second level.

11. The dual-trigger low-energy flip-flop circuit of claim 1, wherein the first isolation transistor is coupled to a first inverter and the second isolation transistor is coupled to a second inverter, and an output of the first inverter is coupled to an input of the second inverter and an output of the second inverter is coupled to an input of the first inverter.

12. The dual-trigger low-energy flip-flop circuit of claim 1, further comprising a first inverter and a second inverter that are configured to form a storage sub-circuit.

13. The dual-trigger low-energy flip-flop circuit of claim 12, further comprising an output inverter that is configured to isolate an output signal from a storage feedback loop within the storage sub-circuit.

14. The dual-trigger low-energy flip-flop circuit of claim 12, a feedback signal that is generated by the storage sub-circuit is configured to disable the first trigger signal or the second trigger signal.

15. The dual-trigger low-energy flip-flop circuit of claim 12, wherein operation of a first trigger sub-circuit configured to generate the first trigger signal, a second trigger sub-circuit configured to generate the second trigger signal, and the storage sub-circuit does not depend on sizing relationships between transistors.

16. The dual-trigger low-energy flip-flop circuit of claim 1, wherein the clock-enabled pull-up transistor is enabled for every Nth clock cycle and N is greater than ten.

17. The dual-trigger low-energy flip-flop circuit of claim 1, further comprising:
   a reset trigger sub-circuit that is configured to arm the first trigger signal when an input signal is at a low level and the level of an output signal is high; and
   a set trigger sub-circuit that is configured to arm the second trigger signal when the input signal is at a high level and the level of the output signal is low.

18. The dual-trigger low-energy flip-flop circuit of claim 17, further comprising a second clock-enabled pull-up transistor that is configured to enable the reset trigger sub-circuit and the set trigger sub-circuit when a clock signal is at a first level.

19. The dual-trigger low-energy flip-flop circuit of claim 18, wherein the clock-enabled pull-up transistor is enabled when the clock signal is at the first level.

20. The dual-trigger low-energy flip-flop circuit of claim 1, wherein only three transistor gates within the dual-trigger low-energy flip-flop circuit are coupled to a clock signal.

* * * * *